US008243497B1

(12) United States Patent
Pellizzer et al.

(10) Patent No.: US 8,243,497 B1
(45) Date of Patent: Aug. 14, 2012

(54) PHASE CHANGE MEMORY DEVICE WITH REDUCED PROGRAMMING DISTURBANCE

(75) Inventors: Fabio Pellizzer, Cornate d'Adda (IT); Agostino Pirovano, Corbetta (IT); Augusto Benvenuti, Lallio (IT); Daniele Vimercati, Besana in Brianza (IT); Andrea Redaelli, Calolziocorte (IT); Gerald Barkley, Oregon, WI (US)

(73) Assignee: Micron Technology, Inc., Boise, ID (US)

( * ) Notice: Subject to any disclaimer, the term of this patent is extended or adjusted under 35 U.S.C. 154(b) by 344 days.

(21) Appl. No.: 12/628,153

(22) Filed: Nov. 30, 2009

(51) Int. Cl.
*G11C 11/00* (2006.01)

(52) U.S. Cl. ........ 365/148; 365/100; 365/115; 365/175; 365/230.04

(58) Field of Classification Search ................... 365/148, 365/100, 115, 175, 230.04
See application file for complete search history.

(56) References Cited

U.S. PATENT DOCUMENTS
2005/0117388 A1* 6/2005 Cho et al. ...................... 365/163
* cited by examiner

*Primary Examiner* — Thong Q Le
(74) *Attorney, Agent, or Firm* — Schwegman, Lundberg & Woessner, P.A.

(57) ABSTRACT

A Phase Change Memory device with reduced programming disturbance and its operation are described. The Phase Change Memory includes an array with word lines and bit lines and voltage controlling elements coupled to bit lines adjacent to an addressed bit line to maintain the voltage of the adjacent bit lines within an allowed range.

21 Claims, 14 Drawing Sheets

PHASE CHANGE MEMORY DEVICE WITH REDUCED PROGRAMMING DISTURBANCE

TECHNICAL FIELD

Embodiments of the present invention relate to memories and especially those memory devices that can store information in non-volatile way; even more specifically embodiments of the invention relate to those non-volatile memories based on phase change materials.

BACKGROUND

In many applications the request for storage capacity is increasing, so non-volatile memories are experiencing a continuous growth. At the same time the demand on their performances becomes more stringent, for example in terms of cycling and data retention. Different kinds of memories are in use, however SRAM and DRAM have problems with non-volatility and soft error rates, while embedded FLASH memories require additional masking layers/processing steps during manufacture, require high-voltage for programming, and have issues with endurance and reliability. Phase Change Memory (PCM) overcomes the short-comings of the above mentioned parameters and exhibits favorable write speeds, small cell sizes, simpler circuitries and a fabrication compatibility with the Complementary Metal-Oxide-Semiconductor (CMOS) process.

BRIEF DESCRIPTION OF THE DRAWINGS

The features and advantages of the present invention will be made apparent by the following detailed description of some embodiments thereof, illustrated merely by way of non-limiting examples in the annexed drawings, wherein.

DETAILED DESCRIPTION

In the following detailed description, numerous specific details are set forth in order to supply a thorough understanding of the embodiments of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g. as in a cause and effect relationship).

Figure 1:
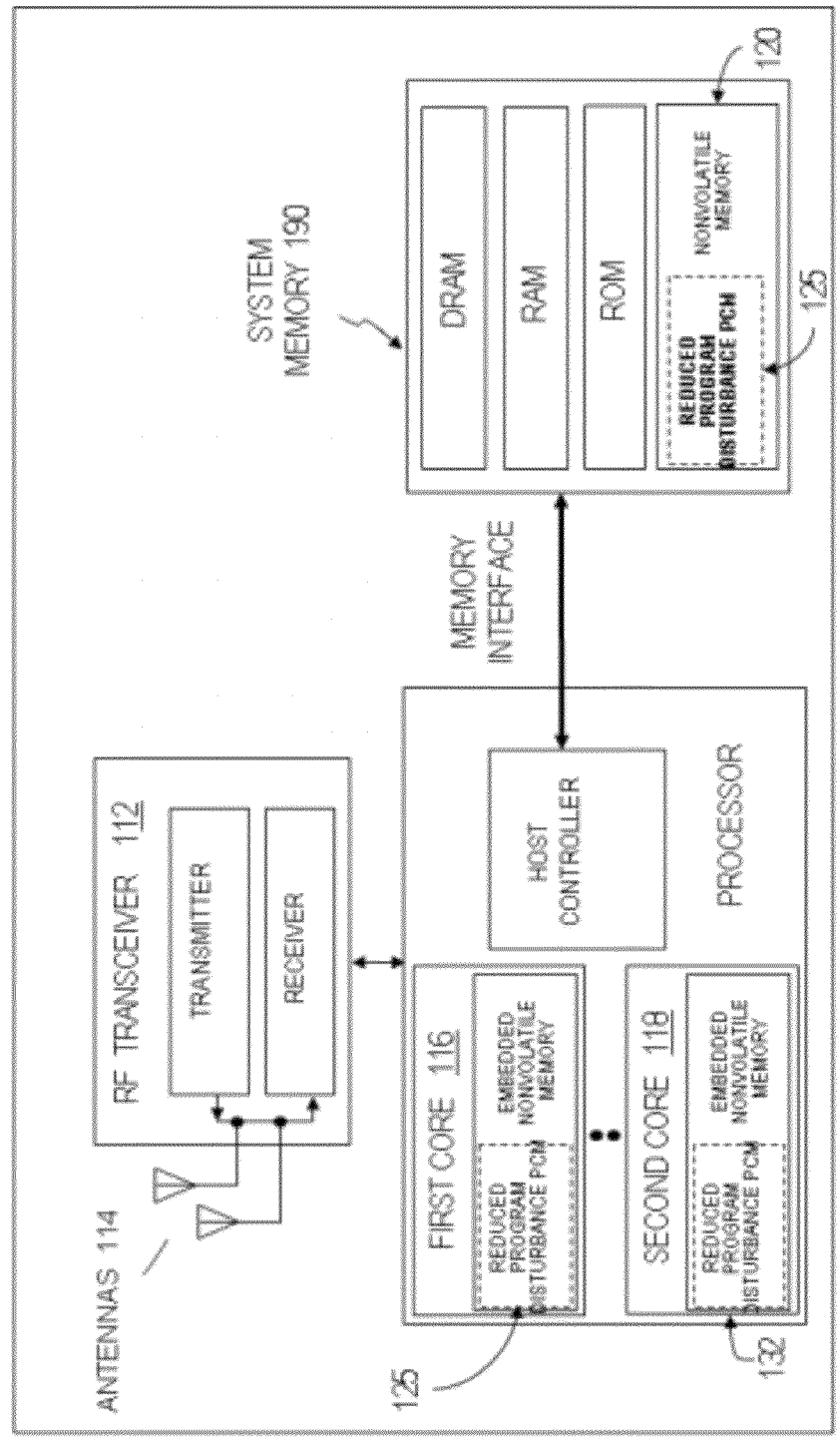
FIG. 1 illustrates an embodiment of a system that incorporates Phase Change Memory (PCM) with program disturbance reduction.

FIG. 1 illustrates an embodiment of a communications device that incorporates Phase Change Memory (PCM) with program disturbance reduction. The communications device 100 includes non-volatile memory with program disturbance reduction; in such memory, when programming a PCM cell, disturbances associated with the programming is reduced on surrounding not addressed cells with respect to prior art. The communications device 100 includes one or more antennas 114 to allow communication with other over-the-air communication devices. As such, the communications device 100 may operate as a cellular device or a device that operates in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), Global System for Mobile Communications (GSM) networks, etc. Additional radio subsystems (not shown in FIG. 1) may be collocated in the same platform of communications device 100 with the capability of communicating with different frequency bands in an RF/location space with other devices in a network.

One or more antennas 114 are coupled to a transceiver 112. In general, the transceiver 112 is a stand-alone Radio Frequency (RF) discrete or integrated analog circuit, or transceiver 112 may be embedded with a processor having one or more processor cores 116 and 118. The multiple cores 116, 118 allow processing workloads to be shared across the cores 116, 118 and handle baseband and application functions. The processor communicates with a memory storage in a system memory 190 through a memory interface. Although the scope of the present invention is not limited in this respect, the interface may comprise serial and/or parallel buses to share information along with control signal lines to be used for handshaking between the processor and system memory 190.

The system memory 190 may be used to store instructions that are executed by the processor during the operation of wireless communication device 100, and may be used to store user data such as the conditions for when a message is to be transmitted by the wireless communication device 100 or the actual data to be transmitted. For example, the instructions stored in system memory 190 may be used to perform wireless communications, ensure security functionality for communication device 100, user functionality such as calendaring, email, internet browsing, etc.

System memory 190 may comprise one or more different types of memory and may include both volatile and a non-volatile memory 120 having a phase change material. Non-volatile memory 120 may be referred to as a Phase Change Memory (PCM), Phase-Change Random Access Memory (PRAM or PCRAM), Ovonic Unified Memory (OUM) or Chalcogenide Random Access Memory (C-RAM).

The volatile and non-volatile memories may be combined in a stacking process to reduce the footprint on a board, packaged separately, or placed in a multi-chip package with the memory component and the processor placed one on top of the other. The embodiment also illustrates that one or more of the processor cores may be embedded with non-volatile memory 132. In another embodiment the system memory 190 includes only one type of memory device, for example of the Phase Change Memory type.

Figure 2:
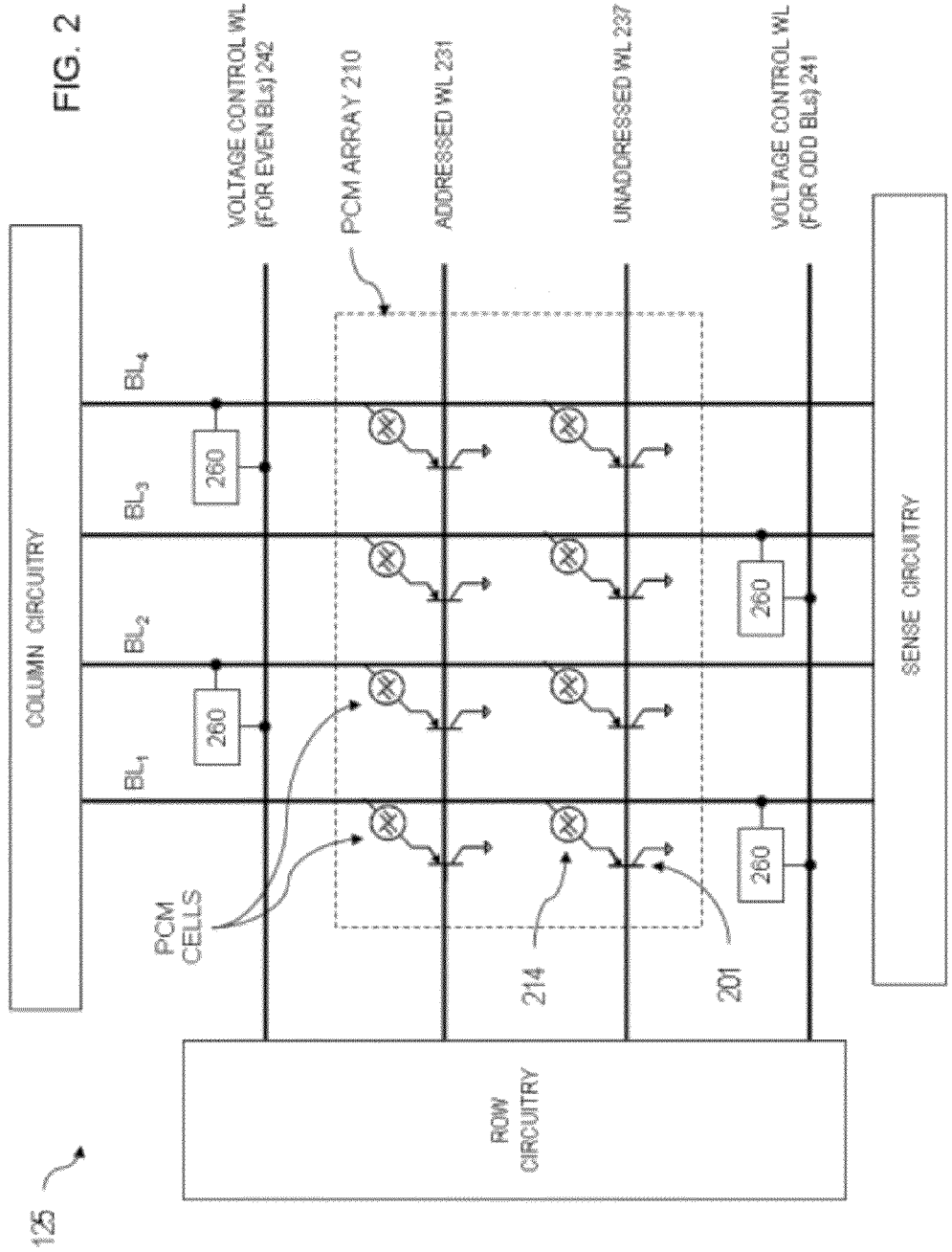
FIG. 2 illustrates a schematic representation of a portion of a memory array according to an embodiment of the invention.

FIG. 2 illustrates an embodiment of programming disturbance reduction Phase Change Memory.

The programming disturbance reduction Phase Change Memory 125 includes a PCM array 210 for storing data in PCM cells. The PCM cells include alloys of elements of group VI of the periodic table, elements such as Te or Se, that are referred to as chalcogenides or chalcogenic materials. Taking the phase change material as $Ge_2Sb_2Te_5$ (GST) for example, two phases or more are exhibited having distinct electrical characteristics useful for memory storage; the chalcogenide compound remains stable even after the power is removed from the non-volatile memory and therefore allows data retention.

Array 210 includes memory cells each having at least a selector device 201 and a storage element 214. Each cell is coupled to a column or bit line ($BL_n$) and to a row or word line (WL) and is located at their crossing and is individually addressable by appropriate selection of corresponding bit line and word line in the column circuitry and in the row circuitry, respectively. Bit lines are also coupled to sense circuitry for reading the cells in the PCM array 210.

Although the array is illustrated with bipolar junction transistors (BJT) as selector devices 201, it should be noted that alternative embodiments may use CMOS selector devices or diodes to identify and selectively change the electrical properties (e.g. resistance, capacitance, etc.) in at least a local portion of the chalcogenide material through the application of energy such as, for example, heat, light, voltage potential, or electrical current. In one embodiment multilevel storage capability in the PCM cells is obtained by electrically switching the chalcogenic material between different states intermediate between the amorphous and the crystalline states.

Figure 8:
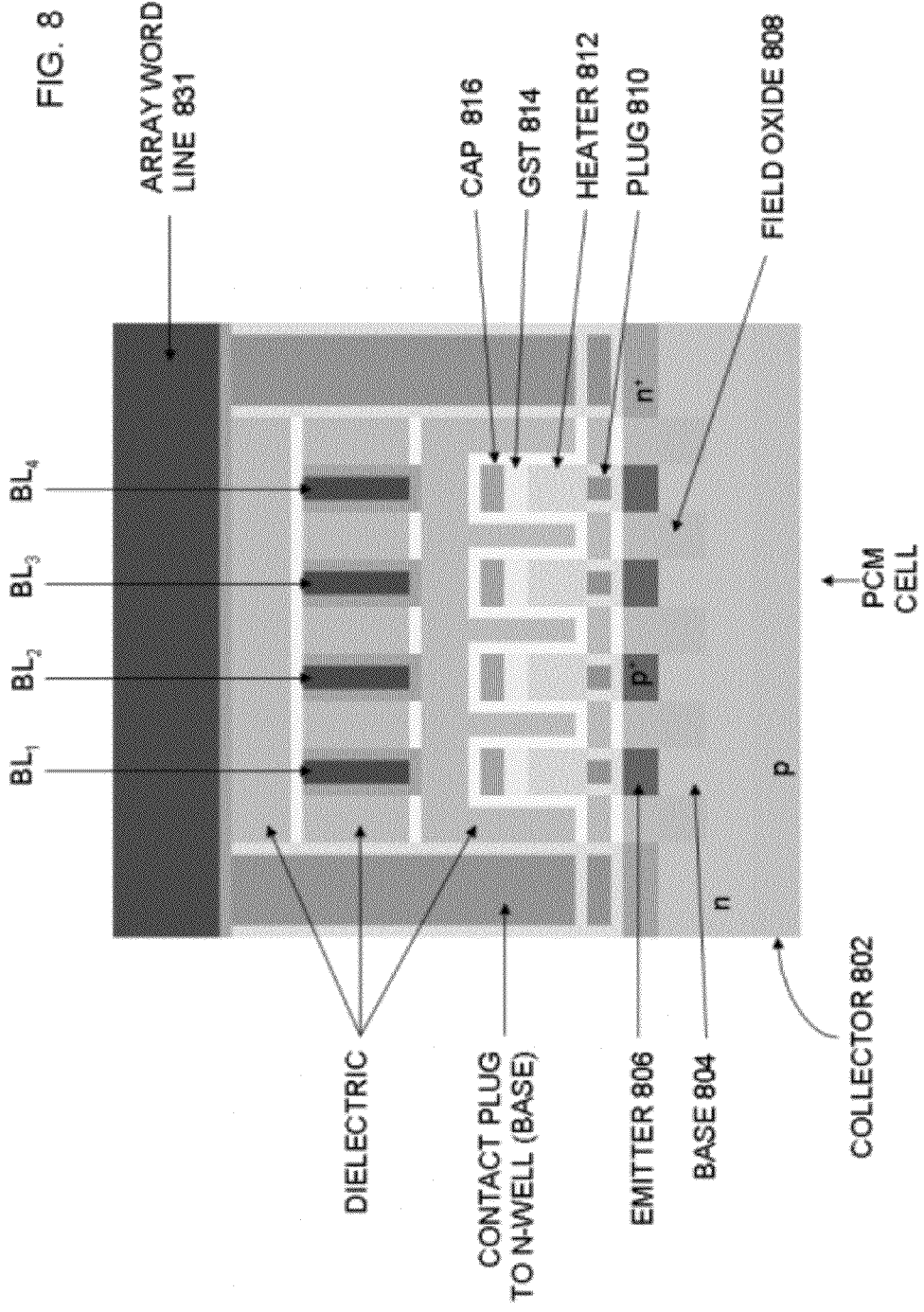
FIG. 8 illustrates an embodiment of a cross-section along a word line in a PCM array.

In one embodiment the PCM cells are grouped in subsets, for example of four cells, in the direction of the word lines, and the base of the BJT selectors is strapped by low-resistance metallic connections, for example with copper lines through contact plugs to the N-type base region, as depicted in FIG. 8). Bit lines may also be strapped, for example with copper lines, at regular intervals, such as every 128 rows (see FIG. 10).

To alter the state or phase of the memory material, a programming voltage potential that is greater than the threshold voltage of the memory select device may be applied to the addressed memory cell. In one embodiment, the addressed word line is biased to a word line programming voltage, for example in the range 0 to 0.5V, i.e. 0.2V, and the addressed bit line is biased to a ramped programming voltage up to about 3 to 6V, i.e. 4.5V. The unaddressed word lines are biased to a program inhibition voltage that may be the bit line programming voltage, to avoid any programming of the PCM cells thereon. More than a single bit line may be simultaneously addressed.

An electrical current flows through the addressed memory cell producing heating of the memory material, for example by Joule effect on a resistive heater coupled between the BJT selector and the chalcogenic material, whose temperature is locally raised above the melting temperature, for example above 600° C. Then the chalcogenic material solidifies under controlled cooling conditions so that the desired memory state or phase of the memory material is obtained, with a correspondingly different electrical characteristic. More precisely, a rapid cooling places the phase-change material in the amorphous state that is referred to as a reset state where stored data has a "0" value. Taking $Ge_2Sb_2Te_5$ as an example, the time between achieving the melting temperature and quenching after the local heating to achieve the amorphous phase may be less than 50 nanoseconds. If the cooling rate is slower, crystallization takes place and where the phase-change material is in the crystalline form it is referred to as a set state and stored data has a "1" value. In another embodiment crystallization from the amorphous phase is obtained by heating the chalcogenic material at a temperature lower than the melting temperature for a sufficiently long time to allow for structural reordering of the solid phase. Thus, the cell can be programmed by setting the amplitude and pulse width of the current that will be allowed through the cell. In summary, a higher magnitude, fast pulse will amorphize the cell, whereas a moderate magnitude, longer pulse will allow the cell to crystallize. It is to be appreciated that the association of reset and set with amorphous and crystalline states, respectively, is a convention and that at least an opposite convention may be adopted. In an embodiment a programming current is directly forced through the memory cell to generate heat resulting in the local melting of the chalcogenic compound; to program the cell, fast/slow GST solidification speed is then obtained by accurate control of duration and amplitude of the programming current pulse.

Figure 3:
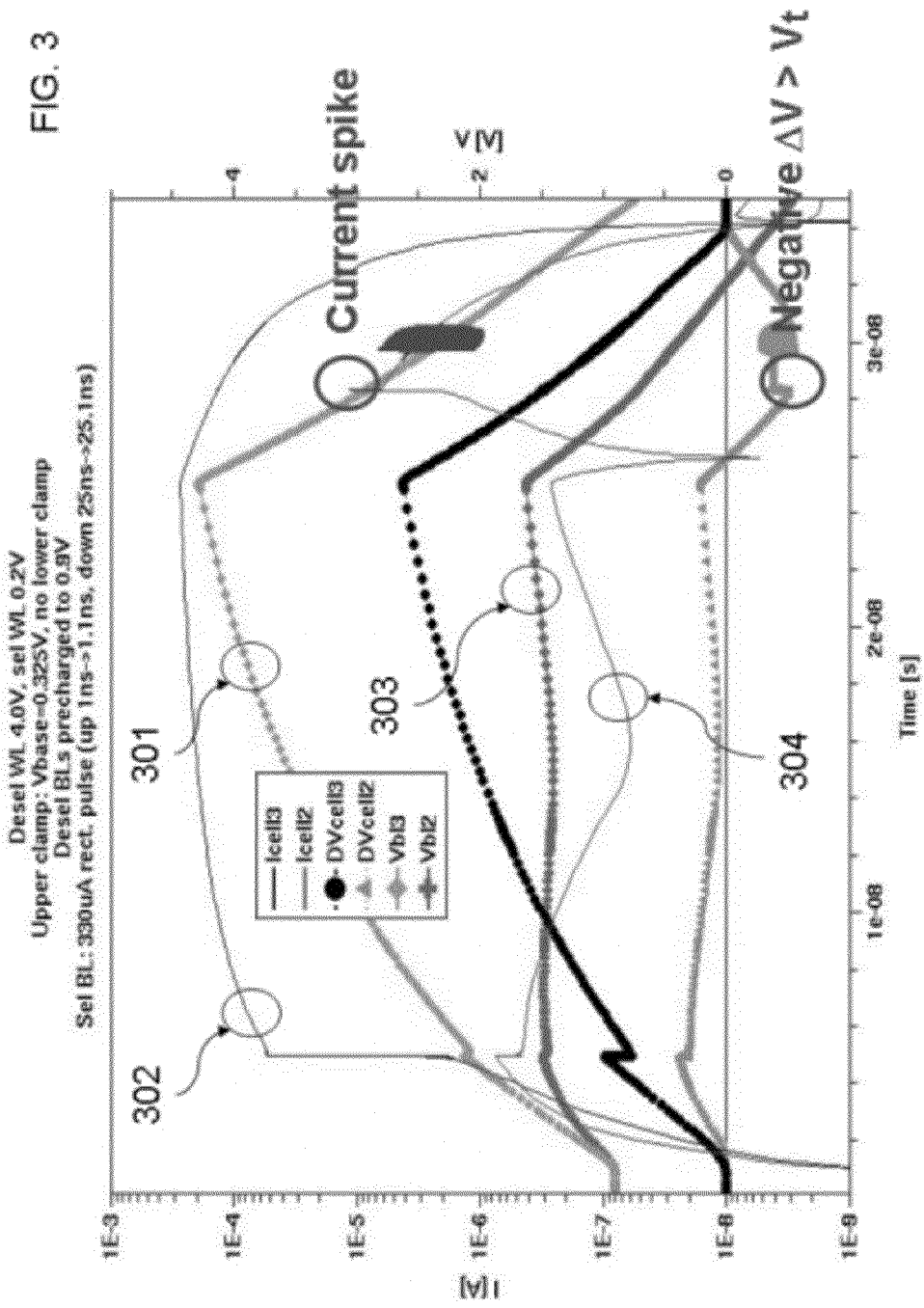
FIG. 3 illustrates signal evolution with time during a programming operation as resulting from device simulation.
Figure 4:
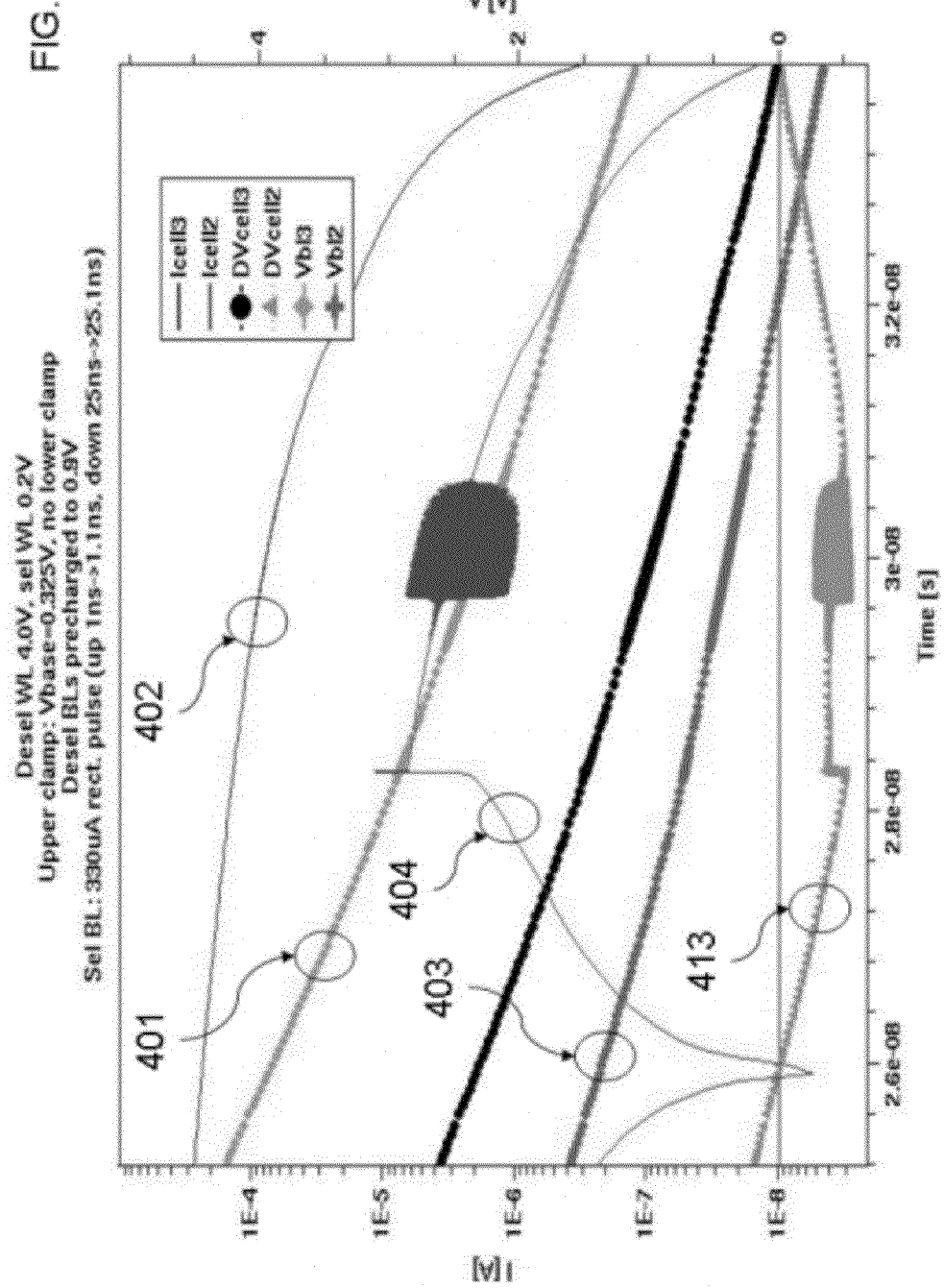
FIG. 4 illustrates an expanded view of the programming pulse ramp-down portion in FIG. 3.

FIG. 3 illustrates the evolution with time of some nodes during a typical programming pulse as resulting from device simulation; in the depicted example the addressed bit line is charged by an essentially rectangular current pulse starting at 1 ns and ending at 25 ns (rise- and fall-time of 0.1 ns). Curve 301 (right scale) reports the voltage of the addressed bit line, while curve 302 (left scale) reports the current flowing through the addressed PCM cell. Initially the bit line voltage and the cell current increase; at about 5 ns the cell threshold is exceeded and a large current flows through the PCM cell, producing the local melting of the chalcogenic material. At 25 ns the programming pulse ends and the addressed bit line quickly discharges; also the current through the PCM cell drops. This quenching phase is depicted with an enlarged time scale in FIG. 4.

In the reduced programming disturbance Phase Change Memory 125 (see FIG. 2), voltage controlling elements 260 are coupled to the bit lines and during programming the use of these elements on unaddressed bit lines helps to prevent undesired changes that may alter the state of unaddressed memory cells. In one embodiment, the elements 260 are grouped in at least two subsets, one coupled to odd bit lines and one to even bit lines. Two voltage controlling word lines 241 and 242 are respectively coupled to voltage controlling elements 260 for odd bit lines and for even bit lines. In the embodiment depicted in FIG. 2 the voltage controlling elements 260 and the voltage control word lines 241 and 242 are located outside of the PCM array 210, for example the two word lines are at opposite sides of the PCM array 210, however they may also be on the same side. In another embodiment, the PCM array 210 is physically (although not necessarily also logically) divided in two or more regions and one or more voltage control word lines with the associated voltage controlling elements are spatially interposed between said physical regions. With such a spatial arrangement the effectiveness of the voltage control effect may be even greater since the bit line RC, or charging/discharging time constant, is diminished. In some embodiments, the voltage controlling elements 260 are decodable with a finer granularity, for example they are individually addressable.

Elements 260 control the unaddressed bit line voltage and help avoid or minimize spurious and undesired effect on PCM cells sharing the addressed word line and on a bit line adjacent to the addressed one during programming. Without elements 260 the voltage of the otherwise floating bit lines adjacent to the addressed one would raise during the program pulse because the unaddressed bit lines are capacitively coupled to the addressed one (for example, because the chalcogenic material lines run parallel to each other, typically at the smallest distance allowed by the technology node used, and so do also the copper metal lines). Such a voltage increase on unaddressed bit lines may result in the undesired programming of the unaddressed PCM cells. The unaddressed bit lines voltage is controlled so that it does not exceed a tolerable value (see FIG. 3, curve 303), therefore avoiding or minimizing possible disturbances on cells adjacent to the addressed cell (curve 304 in FIG. 3 shows the current through the unaddressed cell on $BL_2$, adjacent to the addressed one on $BL_3$; at all times during the programming pulse such a current is sufficiently low so that it does not produce any relevant disturbance). Moreover, since the base of the BJT selectors of the adjacent PCM cells on the same word line is shared, parasitic bipolar transistors are inevitably formed and the emitter of the cell adjacent to the addressed one behaves as collector of such a parasitic BJT producing an undesired current injection into the unaddressed memory cell. Such an undesired current injection is avoided or minimized with the use of elements 260 and correspondingly the unaddressed memory cells are not subjected to possible state change in connection with such an electric disturbance. Typically the voltage of unaddressed bit lines at both sides of an addressed bit line is controlled (for example, if $BL_3$ is the addressed bit line, elements 260 coupled to both $BL_2$ and $BL_4$ control the voltage on these bit lines), however only the voltage of one unaddressed bit line that is adjacent to an addressed one is controlled when the addressed bit line is close to the array border or to a discontinuity in the periodicity of the bit lines (for example, if $BL_4$ is the addressed bit line, $BL_3$ is the only unaddressed adjacent bit line and only element 260 coupled to it controls the voltage on $BL_3$).

Figure 5:
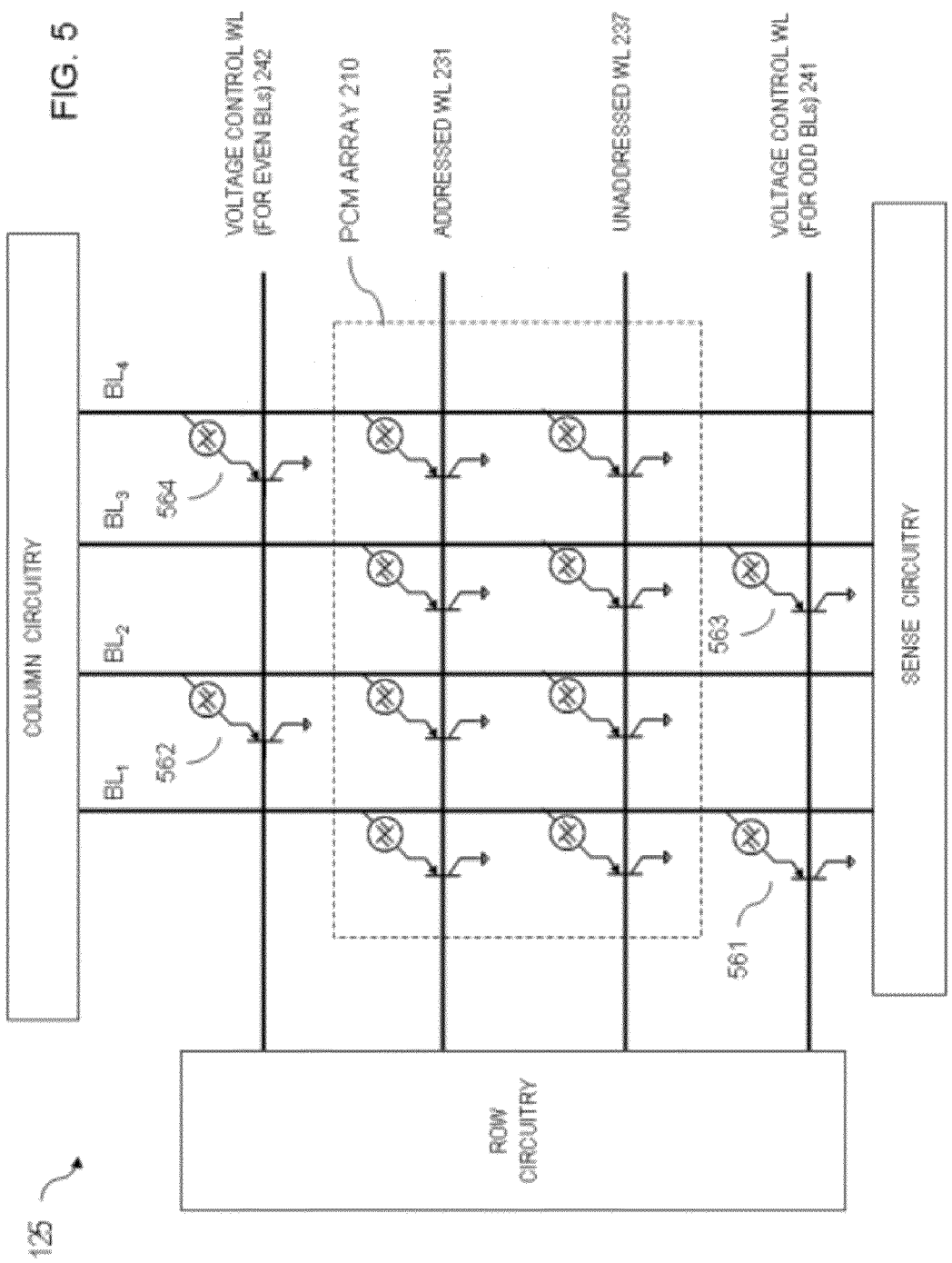
FIG. 5 illustrates a schematic representation of a portion of a memory array according to another embodiment of the invention.

In one embodiment, illustrated in FIG. 5, the voltage controlling elements include a PCM cell. PCM cells 561 and 563 are coupled to bit lines BL1 and BL3 respectively and to voltage control word line 241 for odd bit lines; PCM cells 562 and 564 are coupled to bit lines BL2 and BL4 respectively and to voltage control word line 242 for even bit lines. The chalcogenic material of the cells 561-564 is in its virgin state after processing (i.e. substantially crystalline). In an embodiment the PCM cells 561-564 are programmed to the set state.

During a stand-by period all bit lines are biased to a voltage of about 0.2 to 1.3V, for example 1.0V, through a circuit not shown in the figures. When a program operation command is received the addressed bit line is biased while all other bit lines are left floating. The addressed word line 231 is biased to the word line programming voltage, for example the reference voltage (GND), while the addressed bit line, for example $BL_3$, is biased to the bit line programming voltage (for example 4.5V) and the unaddressed word lines 237 are biased to the program inhibition voltage, as described above.

The voltage control word line 242 for even bit lines, i.e. the one coupled to voltage control PCM cells 562 and 564, is biased to about 0.1 to 1.2V, for example 0.35V, so that current (i.e. displacement current on bit lines $BL_2$ and $BL_4$ adjacent to the addressed one, $BL_3$) is drained through the voltage control PCM cells (chalcogenic material, heater, and BJT selector) and the even bit line voltage does not increase above the threshold voltage of memory cells in the array 210 on the addressed word line 231. Correspondingly, the memory cells are not disturbed (as it would otherwise be the case, especially if they are in the reset state), therefore reducing the risk of threshold switch. The voltage control word line 241 coupled to the odd bit lines is biased to the programming inhibition voltage as are the other unaddressed word lines 237 in the PCM array 210.

Figure 6:
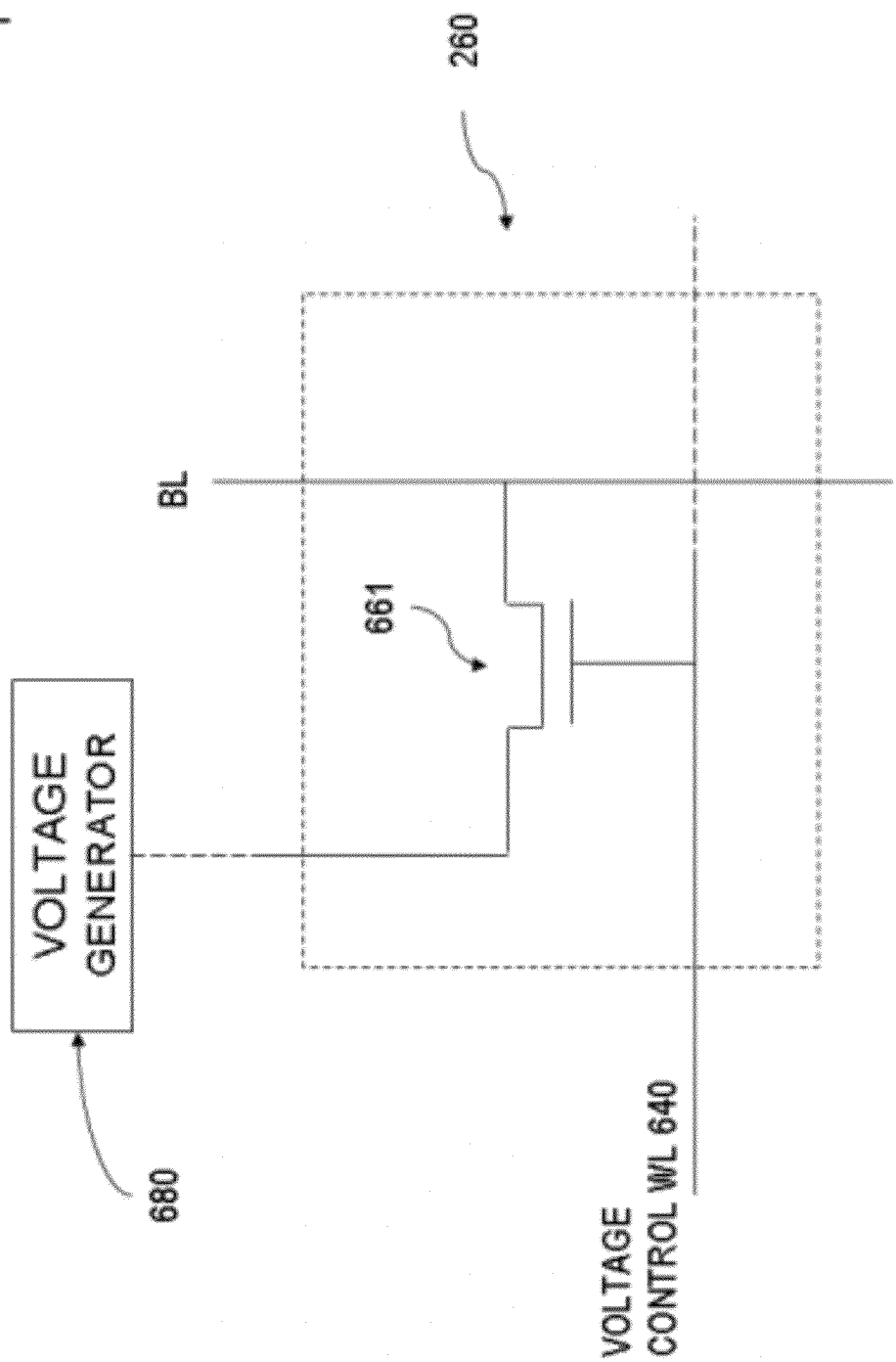
FIG. 6 illustrates a schematic representation of a further embodiment of a voltage controlling element.

In another embodiment, illustrated in FIG. 6, the voltage controlling elements 260 comprise a voltage controlling transistor 661 coupled between the bit line and a voltage generator 680. The gate of voltage controlling transistor 661 is coupled to the voltage control line 640, so that the voltage supplied by the voltage generator 680 is applied to the bit line when the voltage controlling transistor 661 is biased to its ON state. The voltage control line 640 may correspond to the voltage control word line. During programming, a pulse is applied to the addressed bit line and the unaddressed bit line is biased to a voltage of about 0.3 to 1.3V, for example 1.0V, supplied by the voltage generator 680; the voltage control line 640 is biased to a pass voltage, for example 3.0V, so that the transistor 661 effectively transfers the voltage generator voltage to the unaddressed bit line.

In one embodiment, the voltage controlling transistor is a triple-well transistor (not shown in FIG. 6), i.e. its body voltage can be regulated independently from the substrate of the chip. This is achieved by having the transistor's body in a P-well completely embedded into an N-well into the P-type substrate of the chip. With this configuration, by appropriate N-well polarization, a reverse biased diode is always present between the transistor's body and the chip's substrate so that the voltage controlling transistor 661 may regulate the unaddressed bit line voltage not only during the positive ramp of the programming pulse, but also during its negative ramp at the end of the pulse. This avoids or reduces disturbances on unaddressed cells also during the ramp-down of the programming voltage on the addressed bit line (see FIG. 4, curve 401), when adjacent unaddressed bit lines tend to lower their voltage (see FIG. 4, curve 403) through capacitive coupling and an undesired negative current (see FIG. 4, curve 404) may be injected into the unaddressed cells accordingly.

Figure 7:
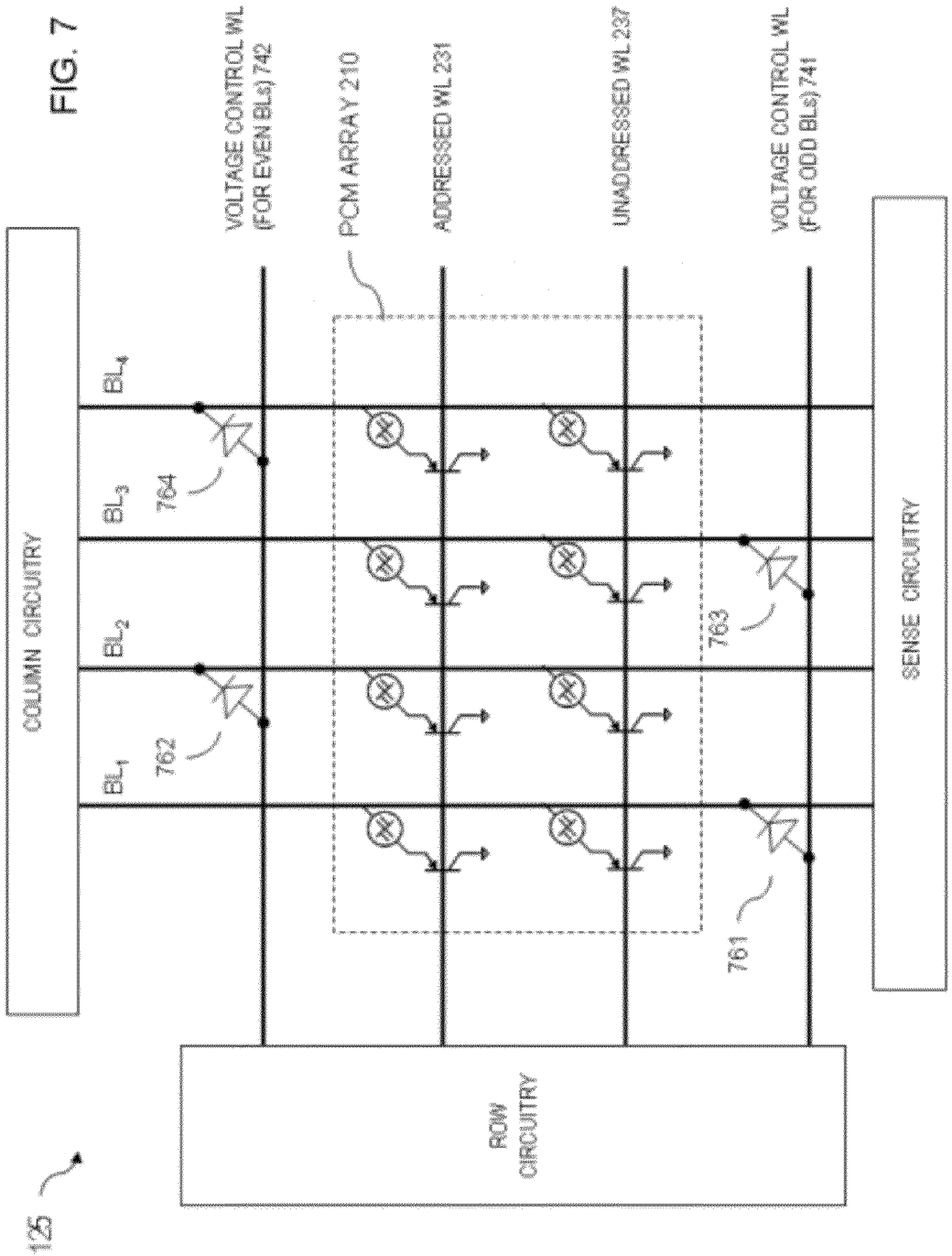
FIG. 7 illustrates a schematic representation of a portion of a memory array according to a further embodiment of the invention.

FIG. 7 illustrates another embodiment comprising voltage controlling diodes (761, 763, . . . ) coupled between a voltage control word line for odd bit lines 741 and odd bit lines ($BL_1$, $BL_3$, . . . ) and voltage controlling diodes (762, 764, . . . ) coupled between a voltage control word line for even bit lines 742 and even bit lines ($BL_2$, $BL_4$, . . . ). During the ramp-down of the programming voltage on the addressed bit line, for example $BL_3$ (see curve 401 in FIG. 4), the voltage of adjacent (unaddressed) bit lines $BL_2$ and $BL_4$ also decreases due to capacitive coupling (curve 403). Eventually the voltage drop on the chalcogenic material of the unaddressed memory cell (curve 413) may become negative and, although the electric field is in the opposite direction with respect to conventional programming, the voltage drop across the phase change material becomes higher than its threshold voltage (about 0.7V for GST) and a current flows that may alter its amorphous/crystalline state, and therefore may possibly also modify the data content of the PCM cells of the unaddressed lines. To avoid or minimize disturbances on adjacent PCM cells also on addressed word line 231, the voltage control word line, 742 in this example, is biased to a positive voltage in the range 0.3 to 2.3V, for example 1.9V. Under these biasing conditions the voltage controlling diodes 762 and 764 are forward biased when the $BL_2$ and/or $BL_4$ bit line voltage tends to be lower by more than a diode's threshold voltage. Accordingly voltage controlling diodes 762 become active, during the ramp-down of the programming pulse on the addressed bit line $BL_3$, by delivering a (forward) positive current and therefore preventing the voltage of adjacent bit lines $BL_2$ and $BL_4$ to decrease below an acceptable value (not shown in FIG. 4). The target biasing condition of the voltage control word lines 741 and 742 depends on the unaddressed bit lines acceptable voltage and on the diode's electrical characteristics (i.e. its driving capability). If the addressed bit line has a different parity, the other voltage control word line is biased, so that in any case the appropriate voltage control diodes coupled to unaddressed bit lines adjacent to the addressed one are activated.

In one embodiment both the voltage controlling elements including a PCM cell (561-564) and the voltage controlling diodes (761-764) are present, each on a corresponding voltage control word line and there-between coupled with an unaddressed bit line, therefore ensuring program disturbance reduction both during the ramp-up and the ramp-down of the program pulse.

Figure 9:
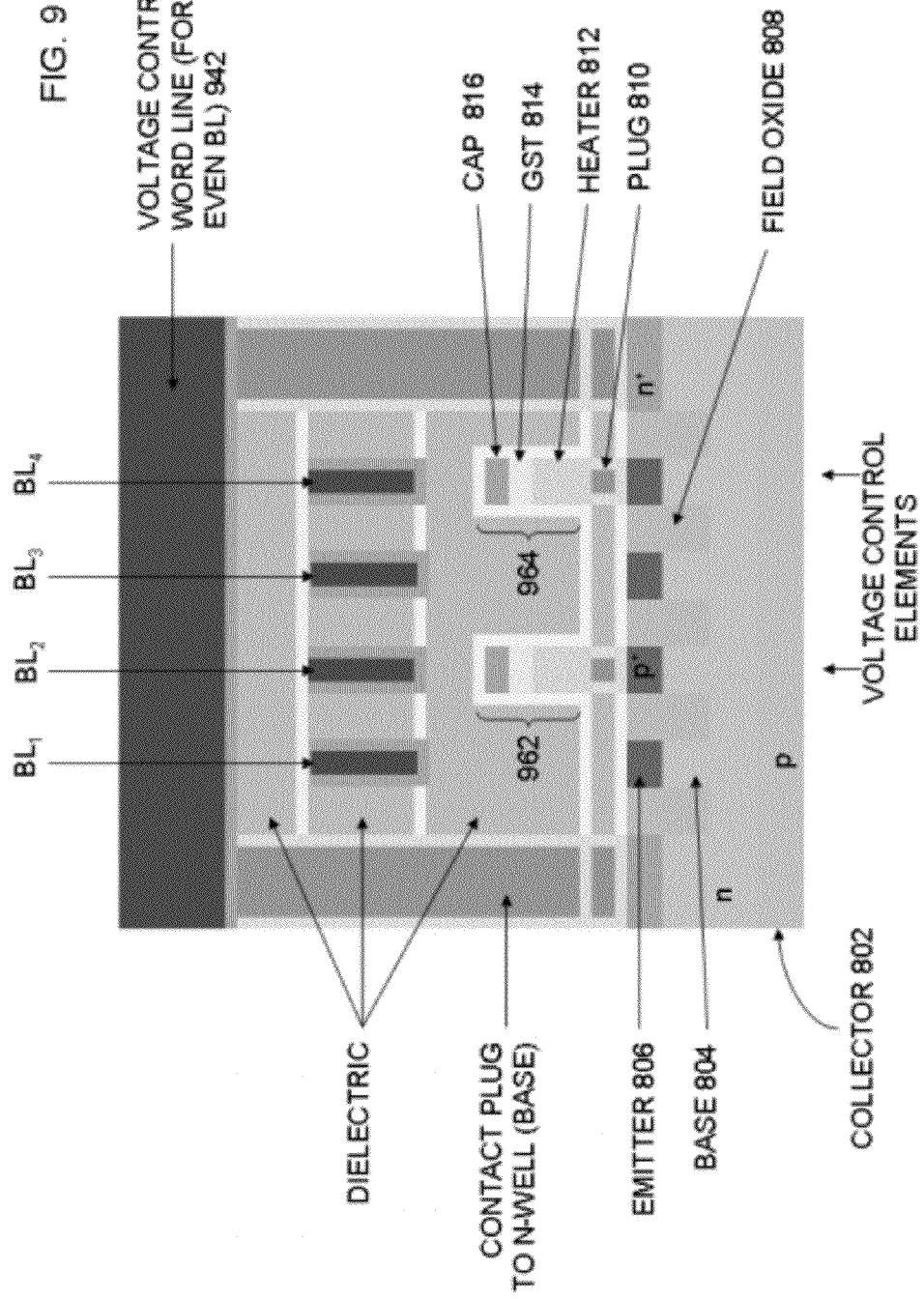
FIG. 9 illustrates a cross-section along a voltage control word line according to an embodiment of the invention.
Figure 10:
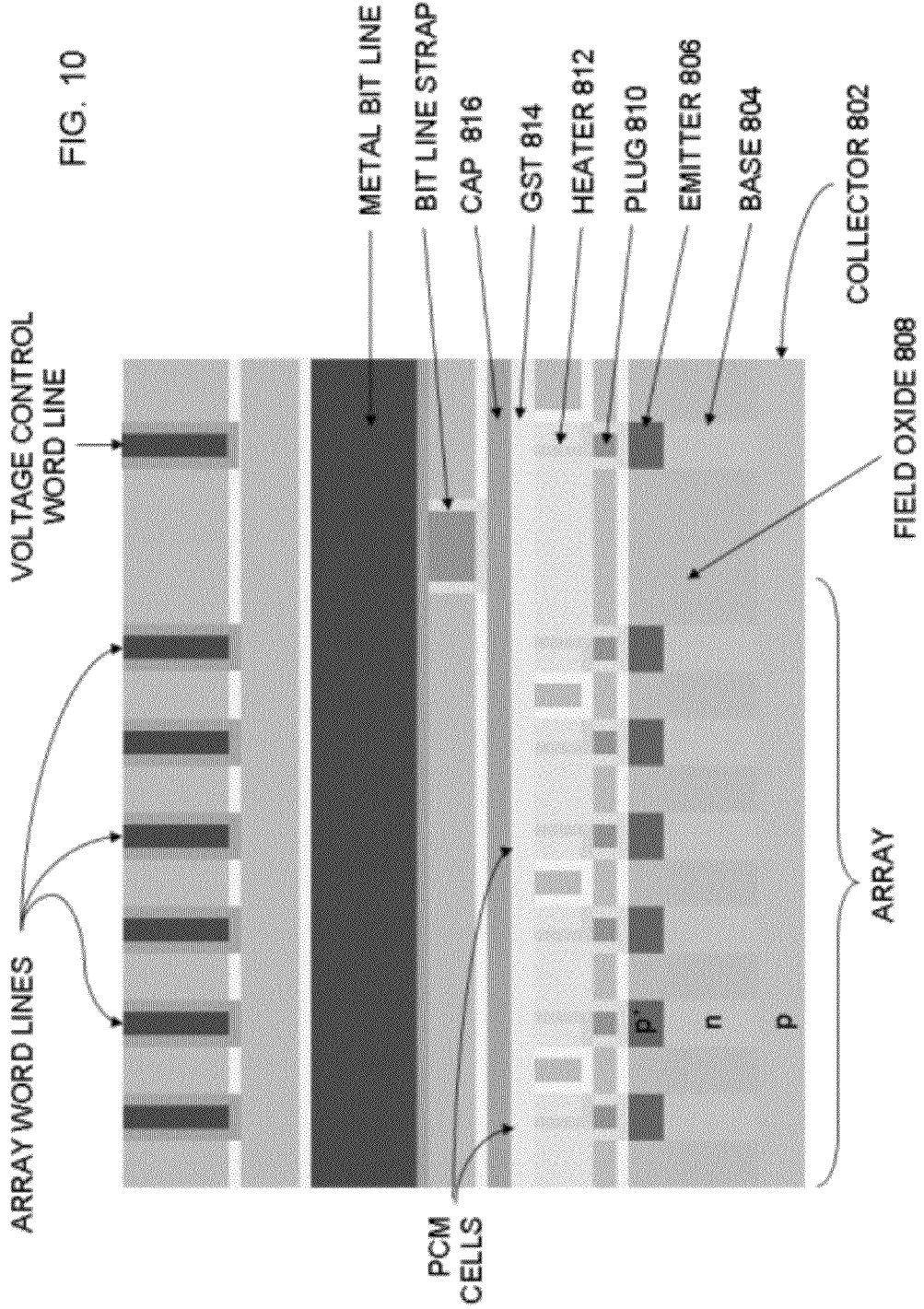
FIG. 10 illustrates a cross section along a bit line according to an embodiment of the invention.
Figure 11:
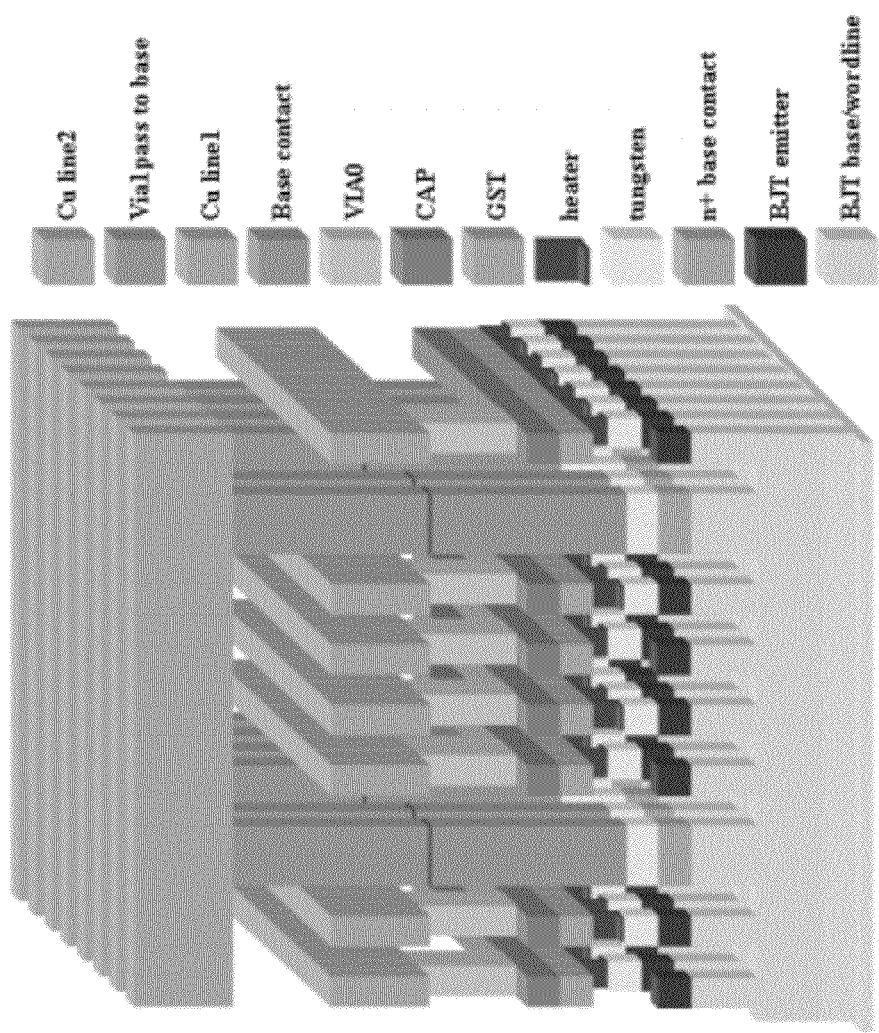
FIG. 11 illustrates a three dimensional perspective view of the embodiment in FIGS. 8-10.

FIG. 8 illustrates a cross section along a word line 831 in the PCM array and FIG. 9 illustrates a cross section along a voltage control word line 942 (for even bit lines in the exemplification of FIG. 9). FIG. 10 illustrates a cross section along a bit line according to one embodiment of the invention. FIG. 11 is a three-dimensional perspective view of a portion of the array whose cross sections are illustrated in FIGS. 8, 9 and 10. In this particular embodiment bit lines are grouped in subsets of four ($BL_1$-$BL_4$) to obtain a low-resistivity base 804 through frequent contacts of the word line to the N-type base; however this is a mere example and another or no grouping at all may be used.

As illustrated in cross section of FIG. 8 and leftmost part of cross section of FIG. 10, each PCM memory cell in the array, with corresponding vertical BJT selection transistor, heater and GST storage material, is coupled to a metal bit line ($BL_1$-$BL_4$), the bit line strap being clearly visible in the cross section along the bit line direction, at the right side of FIG. 10. The collector 802 of the BJT is in a P-type well shared by all cells in the array, while the base 804 is in a N-type well stripe in the word line direction; each N-well stripe is insulated from adjacent N-well stripes by field oxide regions 808 and is coupled to metallic (i.e. copper) word lines on N+ doped contact regions through contact plugs to N-well base, for example comprising tungsten. Each PCM cell has its own emitter 806 in a P-type diffusion. A plug 810, for example including tungsten, is coupled between the emitter 806 and a heater 812. In one embodiment the heater is obtained by conformal deposition of a thin semi-metallic layer, for example of Titanium Nitride, on a patterned surface. A heater mask 1212 creates trenches in the word line direction with a pitch twice the word line pitch in the array region—see FIG. 12. A dielectric layer, for example of Silicon Nitride, is then deposited and etched back, so that double-layer (TiN/$Si_3N_4$) spacers are formed on the vertical sidewall of the trench; the etch removes the TiN material from the bottom of the trench therefore insulating the heater elements on opposite sidewalls of the same trench (therefore the heater pitch in the bit line direction is half that of that of the heater mask 1212). Alternatively the heater may be defined by conventional photolithographic techniques.

Figure 12:
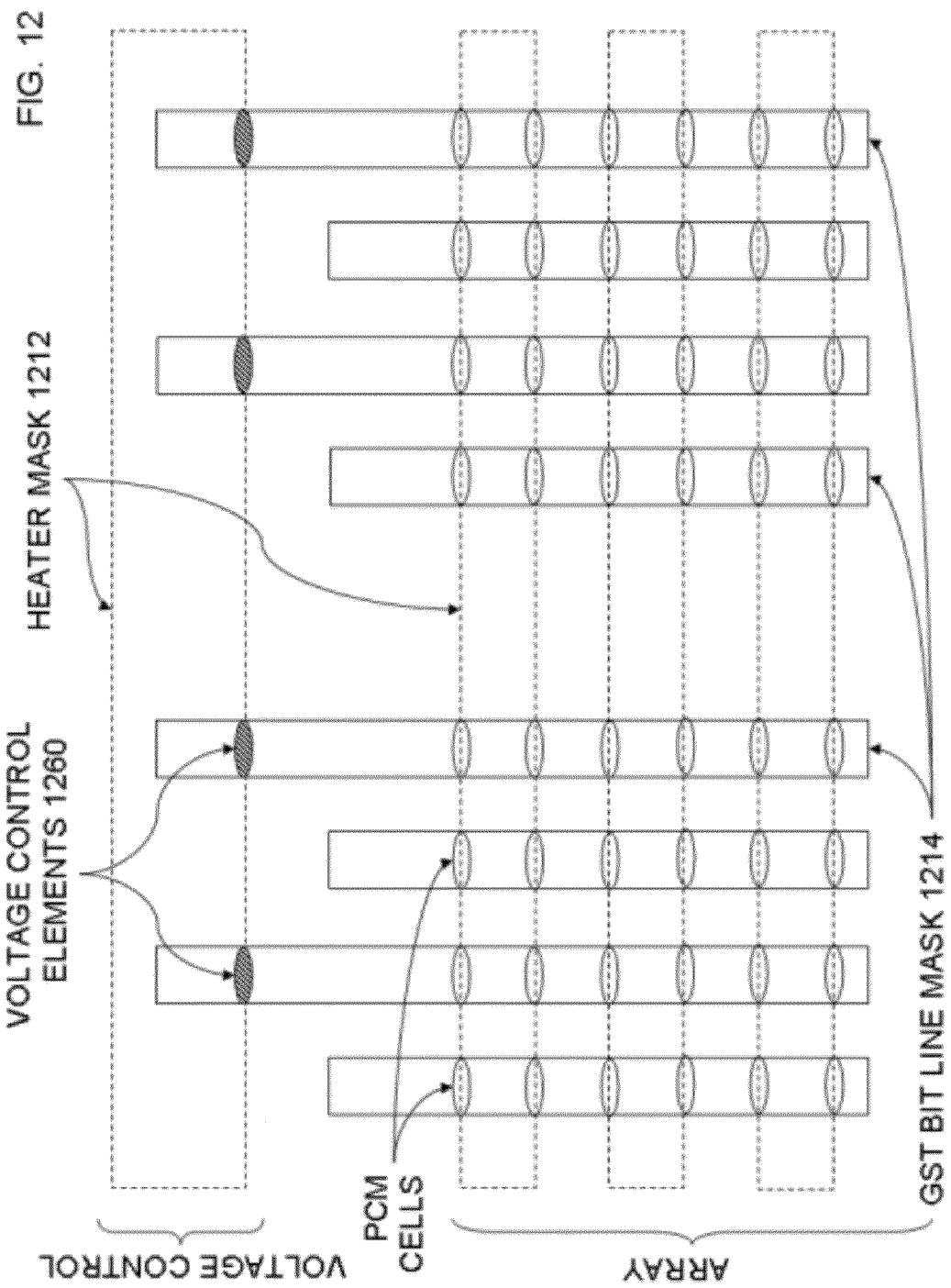
FIG. 12 illustrates the layout of two photo-lithographic masks used in a method to produce a PCM device according to one embodiment of the invention.

A chalcogenic material 814, for example GST, is deposited and capped with a lower resistivity material 816, such as a TiN alloy. PCM memory cells are defined in the bit line direction using a GST bit line mask 1214 (see FIG. 12) that protects the TiN and GST along bit lines and etches it from the regions between adjacent bit lines. A plurality of TiN/GST bit lines is therefore formed. During this operation the heater of each PCM cell is also defined and separated (in the word line direction) from heaters of memory cells on adjacent bit lines. The bit lines are periodically strapped with lower resistivity metal bit lines. PCM memory cells are essentially defined at the crossing of each TiN/GST bit line with each heater (in the word line direction); as shown in FIG. 12 this occurs where each sidewall of the heater mask 1212 overlaps the GST bit line mask 1214. The heater heats when current flows through it and during a program operation it reaches a high temperature (above the melting temperature of the GST), therefore producing the local melting of the chalcogenic material. PCM cells are sealed for example with a SiN layer and insulated with a dielectric such as Silicon Oxide layer; conventional metallization steps follow to complete the metallic interconnections (bit lines, word lines, etc.), i.e. including copper. It is noted that, although not explicitly mentioned in the description above, other layers may be present (barriers, stopping layers, or the like), especially at the interfaces, i.e. W plug/silicon, heater/GST, copper lines, dielectrics, etc.

FIG. 12 shows that the GST bit line mask 1214, at the border of the array region, has an alternate pattern; even bit lines, corresponding to $BL_2$ and $BL_4$ in previous Figures, stretch a longer extension away from the array than odd bit lines, corresponding to $BL_1$ and $BL_3$. In particular even bit lines in this GST bit line mask 1214 at least partially overlap the pattern defined with the heater mask 1212. According to the manufacturing process described above with reference to the array portion of the memory chip, also at the overlap between a sidewall defined by heater mask 1212 and the GST bit line mask 1214 a PCM (voltage control) element 1260 is formed. Such a PCM voltage control elements 1260 (or 962 and 964 in FIG. 9) are only present on even bit lines $BL_2$ and $BL_4$ (the odd GST bit lines not extending to cross the heater mask) and coupled between voltage control word line 942 and even bit lines $BL_2$ and $BL_4$ (see FIG. 9, illustrating the cross section at the sidewall of the heater mask 1212 in the voltage control region in the word line direction).

In a similar fashion a voltage control element for odd bit lines is obtained by stretching the GST bit line mask 1214 further than for even bit lines (for example at the opposite side of the array) in such a way that it crosses an apposite region in the heater mask 1212. In another embodiment the GST bit line mask 1214 is alternatively interrupted for odd and even bit lines within the array region, so that at the interruption no PCM cell is formed (the resulting structure is the same as illustrated in FIG. 9) and the corresponding word line acts as a voltage control word lines for the complementary bit lines (even and odd, respectively).

While in FIGS. 2, 5, and 7 it is shown that voltage control word lines for even and odd bit lines are at opposite sides of the PCM array 210, they may be located on the same side. In one embodiment more than a single voltage controlling element is coupled to each bit lines so that a better current draining and correspondingly a better and more uniform bit line voltage control is obtained. Correspondingly multiple voltage control word lines are present, for example, two word lines, one on one side and the other on the opposite side of the PCM array 210 are present both for odd and even bit lines.

One or more voltage control word lines may also be present within a PCM array. When the voltage controlling elements include a PCM cell, an otherwise normal (i.e. for data storage) word line is coupled only with even or only with odd bit lines by interrupting the GST bit line mask 1214.

Figure 13:
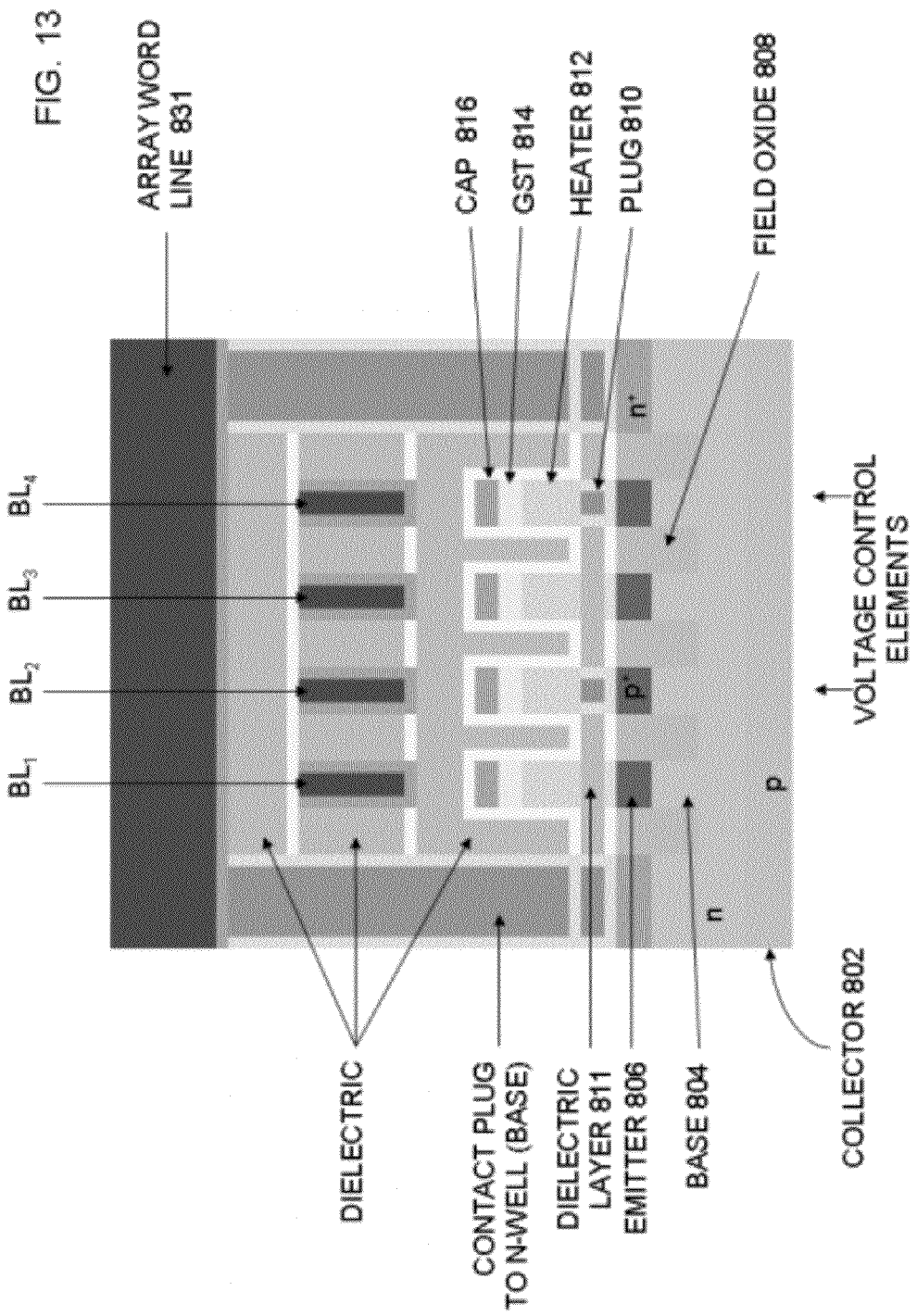
FIG. 13 illustrates a cross-section along a voltage control word line according to a further embodiment.

In another embodiment shown in FIG. 13, only alternate (odd or even) PCM memory cells of a voltage control word line inside (or outside) the array have all the electrical connections between the bit line and the voltage control word line, the other ones (even or odd) lack at least one electrical connection therefore insulating the bit line from the voltage control word line. In the example depicted in FIG. 13 the plug 810 is only present in PCM cells coupled to $BL_2$ and $BL_4$, so that $BL_1$ and $BL_3$ are not connected to the voltage control word line for even bit lines due to the dielectric layer 811 present there-between. Correspondingly the plug is only present at the crossing of the odd bit lines ($BL_1$ and $BL_3$) and the second voltage control word line (for odd bit lines). Globally odd bit lines are insulated from the voltage control word line for even bit lines and even bit lines are insulated from the voltage control word line for odd bit lines. Plugs are selectively formed in the desired locations by appropriate layout of the photolithographic mask opening a through hole in the dielectric layer, where the conductive material (i.e. tungsten) is in electrical contact with the underlying diffusion. The bit line to word line conductive path may be interrupted elsewhere, i.e. by not forming the heater. The voltage control word line decoding must anyhow be independent from the data-storage word line decoding.

In one embodiment, the voltage controlling elements 260 are decoded independently from each other and only voltage controlling elements coupled to bit lines adjacent to addressed bit line are activated during a program pulse.

In all cases the voltage control word lines are not selected during a read operation, so that the voltage controlling elements (260, 561-564, 761-764) do not interfere with the outcome of the memory access in the PCM array 210.

Figure 14:
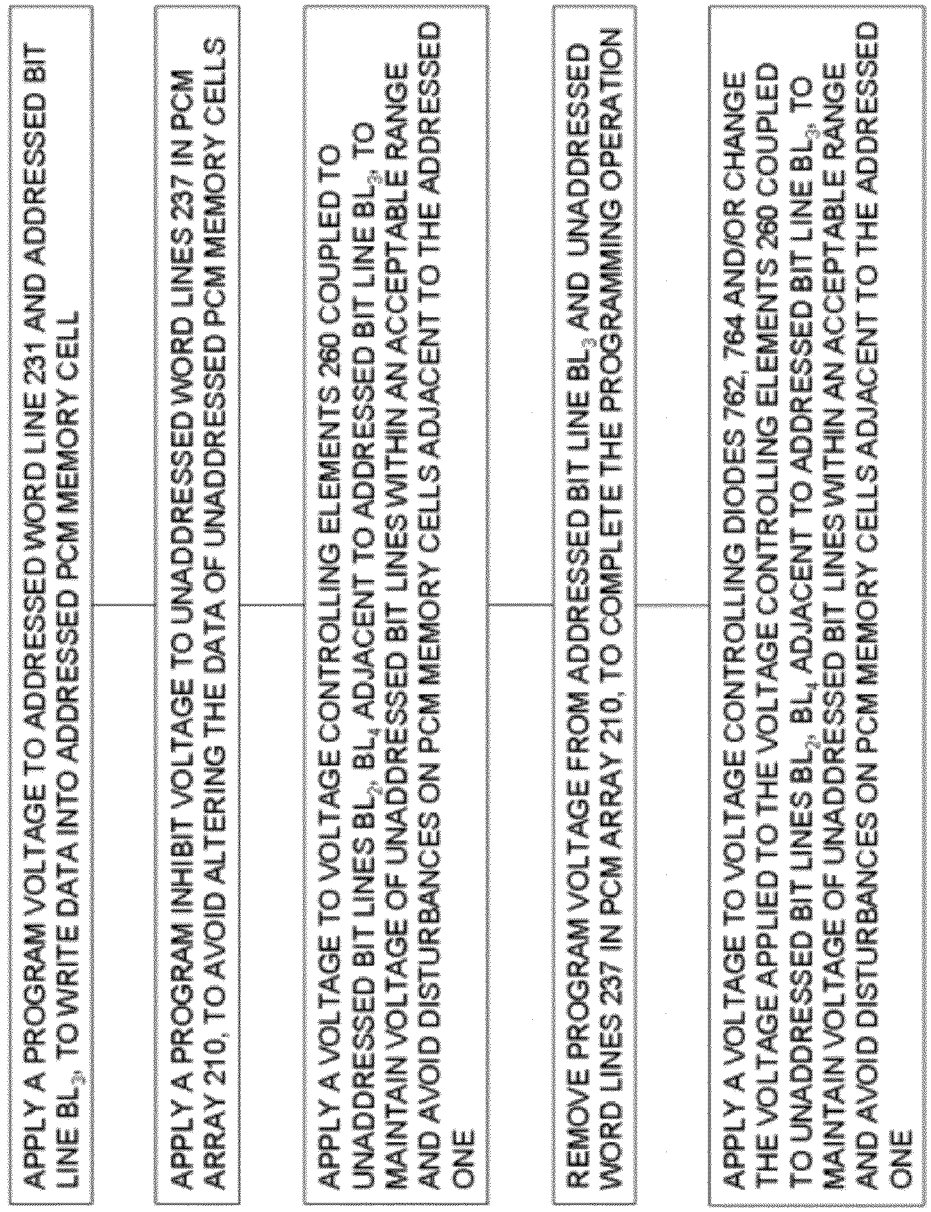
FIG. 14 illustrates an embodiment of programming method.

FIG. 14 illustrates a block diagram of a method to program data into the PCM memory featuring at least one of the embodiments of voltage controlling element 260 described above.

The data is stored at least into an addressed memory cell identified by an address; the addressed memory cell is coupled to an addressed word line and to an addressed bit line; for example, with respect to FIG. 2, the addressed memory cell may be the cell at the crossing of addressed word line 231 and addressed bit line $BL_3$. A word line programming voltage pulse is applied to the addressed word line and a bit line programming voltage pulse is applied to the addressed bit line (if multiple memory cells are addressed, corresponding bit lines are selected for simultaneous programming). For example in the example in mention, the programming voltages are in the range 0 to 0.5V, i.e. 0.2V, on word line 231 and about 3 to 6V, i.e. 4.5V on $BL_3$, respectively. In one embodiment, the bit line voltage is raised with a short pulse, i.e. about 25 ns.

A programming inhibition voltage, for example the bit line programming voltage, is applied to unaddressed word lines 237 in the PCM array 210, to avoid generating an electric field in excess of the threshold voltage of the phase change material and therefore to avoid altering the data stored in unaddressed memory PCM cells. In the example in mention, 4.5V are applied to unaddressed word lines 237.

Voltage controlling elements 260, coupled to unaddressed bit lines $BL_2$ and/or $BL_4$ adjacent to addressed bit line $BL_3$, are biased to a voltage suitable to maintain the voltage of unaddressed bit lines within an acceptable range of 0.5-2.0V, for example about 1.5V such that the chalcogenic material is at no time exposed to an electric field higher than its threshold and/or no parasitic bipolar transistor is turned on, therefore avoiding or minimizing possible disturbances on PCM memory cells adjacent to the addressed one(s). If PCM voltage controlling elements 562 and 564 are present and coupled to unaddressed bit lines $BL_2$ and $BL_4$, the corresponding voltage control word line 242 is biased to 0.2-1.3V, for example 0.45V, so that (i.e. displacement) current is drained from bit lines $BL_2$ and $BL_4$ through the PCM cells (chalcogenic material, heater and BJT selector) and the even bit line voltage is controlled so that the voltage drop across the PCM memory cells in the array 210 does not increase above the threshold voltage (see curve 303 in FIG. 3); correspondingly no or minimal electrical disturbance affects the memory cells, not even those on the addressed word line. If voltage controlling elements 260 comprising voltage controlling transistor 661 are present, the latter is biased in its ON state so as to transfer the voltage supplied by the voltage generator 680 to the unaddressed bit lines $BL_2$ and $BL_4$, as previously described.

The programming voltage is removed from the addressed bit line $BL_3$ to complete the programming operation in a precisely controlled way; the speed of the ramp-down depends on the data to be written into the addressed memory cells (fast ramp-down if the phase change material must be quenched to an amorphous phase and slow ramp-down if time must be allowed for the phase change material to crystallize; intermediate ramp-down in case a partial amorphization is required, i.e. for multilevel data storage). The program inhibition voltage is also removed from the unaddressed word lines 237 in the PCM array 210.

To maintain the voltage of unaddressed bit lines $BL_2$ and $BL_4$, adjacent to addressed bit line $BL_3$, within an acceptable range during the ramp-down of the programming pulse (i.e. to contrast the effect of capacitive coupling), if voltage controlling diodes 762 and 764 are present, a voltage in the range 0.3 to 2.0V, for example 1.4V, is applied to the voltage control word line 742 coupled to the diodes. Therefore possible disturbances on PCM memory cells adjacent to the addressed one(s) are avoided or minimized. If PCM voltage controlling elements 562 and 564 are also present and coupled to unaddressed bit lines $BL_2$ and $BL_4$ (in parallel to voltage controlling diodes 762 and 764, respectively) the corresponding voltage control word line 242 during this phase is biased to a voltage that inhibits the bipolar selection transistors from entering the forward active region. In case the voltage controlling element 260 comprises the voltage controlling transistor 661, its biasing conditions, as well as the voltage supplied by the voltage generator 680 coupled to it, are adjusted to avoid that the voltage of unaddressed bit lines $BL_2$ and $BL_4$, adjacent to addressed bit line $BL_3$, moves out of the allowed range.

The exact sequence of the steps described above may be modified without departing from the scope of the invention and only some of the steps need to be implemented, for example in one embodiment no voltage controlling operation is actuated during program pulse ramp-down.

In the foregoing specification, the invention has been described with reference to specific exemplary embodiments thereof. It will, however, be evident that various modifications and changes may be made thereto without departing from the broader spirit and scope of the invention as set forth in the appended claims. For example, the PCM array may include MOS selection transistor rather than BJT selection transistors and/or the structure of the elementary PCM cell may be different from the one described and the manufacturing process varied accordingly. The specification and drawings are, accordingly, to be regarded in an illustrative rather than a restrictive sense.

The invention claimed is:

1. A Phase Change Memory device comprising:
   a memory cell coupled to a first word line and to a first bit line;
   a second bit line adjacent to the first bit line; and
   a voltage controlling element directly coupled to the second bit line to control a voltage of the second bit line during a programming operation of the memory cell.

2. The Phase Change Memory device of claim 1 further comprising:
   a second memory cell coupled to the first word line and to the second bit line, wherein the voltage controlling element is further to inhibit programming of the second memory cell.

3. The Phase Change Memory device of claim 1 wherein the voltage controlling element is coupled to a voltage control word line.

4. The Phase Change Memory device of claim 1 wherein the voltage controlling element comprises a voltage controlling transistor.

5. The Phase Change Memory device of claim 4 wherein the voltage controlling transistor is coupled between the second bit line and a voltage generator.

6. The Phase Change Memory device of claim 5 wherein a voltage control word line is coupled to a gate terminal of the voltage controlling transistor.

7. A Phase Change Memory device comprising:
   a memory cell coupled to a first word line and to a first bit line;
   a second bit line adjacent to the first bit line; and
   a voltage controlling element coupled to the second bit line to control a voltage of the second bit line during a programming operation of the memory cell, wherein the voltage controlling element comprises a voltage controlling diode and the voltage controlling diode is coupled between the second bit line and the voltage control word line.

8. A Phase Change Memory device comprising:
   a memory cell coupled to a first word line and to a first bit line;
   a second bit line adjacent to the first bit line; and
   a voltage controlling element coupled to the second bit line to control a voltage of the second bit line during a programming operation of the memory cell, wherein the voltage controlling element comprises a Phase Change Memory cell.

9. The Phase Change Memory device of claim 8 wherein the Phase Change Memory cell is coupled between the second bit line and the voltage control word line.

10. A Phase Change Memory device comprising:
    a memory cell coupled to a first word line and to a first bit line;
    a second bit line adjacent to the first bit line; and
    a voltage controlling element coupled to the second bit line to control a voltage of the second bit line during a programming operation of the memory cell;
    a third bit line adjacent to the first bit line on an opposite side of the second bit line; and
    a second voltage controlling element coupled to the third bit line to control a voltage of the third bit line during the programming operation of the memory cell, wherein the second voltage controlling element is coupled to the voltage control word line.

11. The Phase Change Memory device of claim 10 further comprising:
    a third voltage controlling element coupled to the first bit line to control a voltage of the first bit line during a programming operation of the second memory cell;
    a fourth bit line adjacent to the third bit line;
    a fourth voltage controlling element coupled to the fourth bit line to control a voltage of the fourth bit line during the programming operation of the second memory cell; and
    a second voltage control word line, wherein the third and the fourth voltage controlling elements are coupled to the second voltage control word line.

12. A method to program a first memory cell of Phase Change Memory device comprising:
    applying a word line programming voltage to a first word line and a bit line programming voltage to a first bit line to write data into the first memory cell; and
    applying a voltage to a voltage controlling element directly coupled to a second bit line to control the voltage of the second bit line and prevent data stored in a second memory cell coupled to the first word line from being altered by the writing data into the first memory cell.

13. A method to program a first memory cell of Phase Change Memory device comprising:
    applying a word line programming voltage to a first word line and a bit line programming voltage to a first bit line to write data into the first memory cell; and
    applying a voltage to a voltage controlling element coupled to a second bit line to control the voltage of the second bit line and prevent data stored in a second memory cell coupled to the first word line from being altered by the writing data into the first memory cell, wherein the voltage controlling element comprises a voltage controlling diode coupled between the second bit line and a voltage control word line.

14. The method of claim 13, further comprising:
    removing the bit line programming voltage from the first bit line to complete the programming operation of the first memory cell; and
    applying a voltage to the voltage control word line during the removing the bit line programming voltage to control the voltage of the second bit line.

15. A wireless communication device, comprising:
    a transceiver to receive over-the-air signals;
    a processor core coupled to the transceiver; and
    a Phase Change Memory coupled to the processor core, the Phase Change Memory comprising,
    a memory cell coupled to a first word line and to a first bit line;
    a second bit line adjacent to the first bit line; and
    a voltage controlling element directly coupled to the second bit line to control the voltage of the second bit line during a programming operation of the memory cell.

16. The wireless communication device of claim 15 wherein the voltage controlling element is coupled to a voltage control word line.

17. A wireless communication device, comprising:
    a transceiver to receive over-the-air signals;
    a processor core coupled to the transceiver; and
    a Phase Change Memory coupled to the processor core, the Phase Change Memory comprising,
    a memory cell coupled to a first word line and to a first bit line;
    a second bit line adjacent to the first bit line; and
    a voltage controlling element coupled to the second bit line to control the voltage of the second bit line during a programming operation of the memory cell, wherein the voltage controlling element comprises a Phase Change Memory cell coupled between the second bit line and the voltage control word line.

18. A Phase Change Memory (PCM) device comprising:
- a first and second PCM cells;
- a first bit line coupled to the first PCM cell;
- a second bit line coupled to the second PCM cell;
- a first voltage control line coupled to the first bit line;
- a second voltage control line coupled to the second bit line;
- a first voltage regulating element directly coupled between the first PCM cell and the first voltage control line, wherein the first voltage regulating element to control a voltage of the first bit line during a programming operation of the second memory cell; and
- a second voltage regulating element coupled between the second PCM cell and the second voltage control line, wherein the second voltage regulating element to control a voltage of the second bit line during a programming operation of the first memory cell.

19. A Phase Change Memory (PCM) device comprising:
- a first and second PCM cells;
- a first bit line coupled to the first PCM cell;
- a second bit line coupled to the second PCM cell;
- a first voltage control line coupled to the first bit line;
- a second voltage control line coupled to the second bit line;
- a first voltage regulating element coupled between the first PCM cell and the first voltage control line, wherein the first voltage regulating element to control a voltage of the first bit line during a programming operation of the second memory cell; and
- a second voltage regulating element coupled between the second PCM cell and the second voltage control line, wherein the second voltage regulating element to control a voltage of the second bit line during a programming operation of the first memory cell, wherein the first and second voltage regulating elements comprise a PCM cell at a crossing of a bit line mask with a heater mask, wherein the bit line mask has a first pattern associated with the first bit line extending more than a second pattern associated with the second bit line on a side of the PCM device to intersect a pattern of the heater mask.

20. A Phase Change Memory (PCM) device comprising:
- a first and second PCM cells;
- a first bit line coupled to the first PCM cell;
- a second bit line coupled to the second PCM cell;
- a first voltage control line coupled to the first bit line;
- a second voltage control line coupled to the second bit line;
- a first voltage regulating element coupled between the first PCM cell and the first voltage control line, wherein the first voltage regulating element to control a voltage of the first bit line during a programming operation of the second memory cell; and a second voltage regulating element coupled between the second PCM cell and the second voltage control line, wherein the second voltage regulating element to control a voltage of the second bit line during a programming operation of the first memory cell, wherein the first voltage control line is insulated from the second bit line and the second voltage control line is insulated from the first bit line.

21. The PCM device of claim 20 further comprising:
- a first selection transistor coupled to the first voltage control line;
- a first heater coupled to the first bit line;
- a second selection transistor coupled to the first voltage control line; and
- a second heater coupled to the second bit line, wherein a plug is coupled between the first selection transistor and the first heater to couple the first voltage control line and the first bit line, and a dielectric layer is interposed between the second selection transistor and the second heater to decouple the first voltage control line from the second bit line.

* * * * *